(12) United States Patent
Miyai et al.

(10) Patent No.: US 6,580,112 B2
(45) Date of Patent: Jun. 17, 2003

(54) METHOD FOR FABRICATING AN OPEN CAN-TYPE STACKED CAPACITOR ON AN UNEVEN SURFACE

(75) Inventors: Yoichi Miyai, Toride (JP); Masayuki Moroi, Richardson, TX (US); Katsushi Boku, Ami-machi (JP); Toshiyuki Nagata, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/855,401

(22) Filed: May 15, 2001

(65) Prior Publication Data

US 2001/0031530 A1 Oct. 18, 2001

Related U.S. Application Data

(62) Division of application No. 09/373,484, filed on Aug. 12, 1999.
(60) Provisional application No. 60/096,656, filed on Aug. 31, 1998.

(51) Int. Cl.$^7$ ............................................. H01L 27/108
(52) U.S. Cl. ..................... 257/308; 257/303; 257/306; 257/308; 257/309; 438/244; 438/387; 438/396
(58) Field of Search ................. 438/396, 253, 438/239, 618, 241, 254, 256, 257, 258, 397, 398, 399; 257/307, 308, 316, 317, 318, 306

(56) References Cited

U.S. PATENT DOCUMENTS

| | | | |
|---|---|---|---|
| 5,192,702 A | | 3/1993 | Tseng |
| 5,451,537 A | | 9/1995 | Tseng et al. |
| 5,459,094 A | | 10/1995 | Jun |
| 5,459,344 A | * | 10/1995 | Wakamiya et al. ......... 257/307 |
| 5,543,345 A | * | 8/1996 | Liaw et al. ................ 438/397 |
| 5,604,147 A | * | 2/1997 | Fischer et al. ............. 438/396 |
| 6,018,172 A | | 1/2000 | Hidaka et al. |
| 6,140,201 A | | 10/2000 | Jenq et al. |
| 6,303,956 B1 | * | 10/2001 | Sandhu et al. .............. 257/306 |

* cited by examiner

Primary Examiner—George Fourson
Assistant Examiner—Julio J. Maldonado
(74) Attorney, Agent, or Firm—Gerald E. Laws; W. James Brady, III; Frederick J. Telecky, Jr.

(57) ABSTRACT

An open can-type stacked capacitor is fabricated by forming a conductive layer (30, 130) outwardly of a substantially uneven surface (12, 112). A step (50, 150) is formed in an outer surface (32, 132) of the conductive layer (30, 130). A base (72, 172, 202) of a first electrode (70, 170, 200) is formed by removing a predetermined thickness (66, 166) of at least part of the conductive layer (30, 130). The base (72, 172, 202) is made of a portion of the conductive layer (30, 130) underlying the step (50, 150) by the predetermined thickness (66, 166). A sidewall (74, 174) of the first electrode (70, 170, 200) is formed. A dielectric layer (80) is formed outwardly of the first electrode (70, 170, 200). A second electrode (82) of the capacitor is formed outwardly of the dielectric layer (80).

6 Claims, 7 Drawing Sheets

METHOD FOR FABRICATING AN OPEN CAN-TYPE STACKED CAPACITOR ON AN UNEVEN SURFACE

This is a Divisional Application of Ser. No. 09/373,484, filed Aug. 12, 1999 which claims under 35 USC §119 (e) (1) of Provisional Application No. 60/096,656 filed Aug. 31, 1998.

RELATED APPLICATIONS

This application is related to copending U.S. application Ser. No. 09/373,214, entitled "Method for Fabricating an Open Can-Type Stacked Capacitor on Local Topology".

TECHNICAL FIELD OF THE INVENTION

This invention relates generally to electronic devices, and more particularly to a method for fabricating an open can-type stacked capacitor on an uneven surface.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate and interconnected to form memory arrays, logic structures, timers and other integrated circuits. One type of memory array is a dynamic random access memory (DRAM) in which memory cells retain information only temporarily and are refreshed at periodic intervals. Despite this limitation, DRAMs are widely used because they provide low cost per bit of memory, high device density and feasibility of use.

In a DRAM, each memory cell typically includes an access transistor coupled to a storage capacitor. In order to fabricate high density DRAMs, the storage capacitors must take up less planar area in the memory cells. As storage capacitors are scaled down in dimensions, a sufficiently high storage capacity must be maintained. Efforts to maintain storage capacity have concentrated on building three-dimensional capacitor structures that increase the capacitor surface area. The increased surface area provides for increased storage capacity. Three-dimensional capacitor structures include trench capacitors and stacked capacitors.

For stacked capacitors, the storage node generally extends significantly above the surface of an underlying substrate in order to provide a large surface area and thus sufficient storage capacity. This leads to topological problems in the formation of subsequent layers of the DRAM. Such topological problems are reduced by the use of open can-type stacked capacitors that use annular electrodes to increase surface area of the storage node while minimizing height. However, open can-type stacked capacitors have needed a planarized surface on which to be formed, which limits the applications in which they can be used and adds cost to the fabrication process.

SUMMARY OF THE INVENTION

In accordance with the present invention, an improved open can-type stacked capacitor and method are provided that substantially eliminate or reduce disadvantages and problems associated with previously developed systems and methods. In particular, the present invention provides a method for fabricating an open can-type stacked capacitor on a substantially uneven surface, such as an insulator with protruding bit lines.

In one embodiment of the present invention, a method for fabricating an open can-type stacked capacitor includes forming a conductive layer outwardly of a substantially uneven surface. A step is formed in an outer surface of the conductive layer. A base of a first electrode is formed by removing a predetermined thickness of at least part of the conductive layer. The base comprises a portion of the conductive layer underlying the step by the predetermined distance. A sidewall of the first electrode is formed. A dielectric layer is formed outwardly of the first electrode. A second electrode of the capacitor is formed outwardly of the dielectric layer.

More specifically, in accordance with a particular embodiment of the present invention, the substantially uneven surface includes first and second bit lines of a dynamic random access memory (DRAM). The first and second bit lines extend from an insulator and are spaced apart from each other by a trough. The step is formed over the trough such that the base of the first electrode is disposed in the trough. The sidewall of the first electrode is coupled to the base in the trough and extends outwardly of the trough and the first and second bit lines.

Technical advantages of the present invention include providing an improved method for forming an open can-type stacked capacitor. In particular, an open can-type stacked capacitor is formed on an uneven surface, such as on and between bit lines extending from an insulator. As a result, planarization of an underlying surface can be omitted and the cost of manufacturing the capacitor is reduced.

Another technical advantage of the present invention includes an improved method for forming a DRAM. Still, another technical advantage is the elimination of extended wet etching processes used for planarization. Accordingly, particle generation associated with wet etching is minimized.

Other technical advantages will be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

The preferred embodiments of the present invention and its advantages are best understood by referring to FIGS. 1 through 4 of the drawings, in which like numerals refer to like parts throughout the several views.

FIGS. 1A–I are a series of schematic cross-sectional diagrams illustrating fabrication of an open can-type stacked capacitor on a substantially uneven surface in accordance with one embodiment of the present invention. In this embodiment, the open can-type stacked capacitor is a storage capacitor for a dynamic random access memory (DRAM) cell. The open can-type stacked capacitor and method of the present invention may be used in connection with other suitable types of memory arrays and electronic circuits.

Figure 1A:
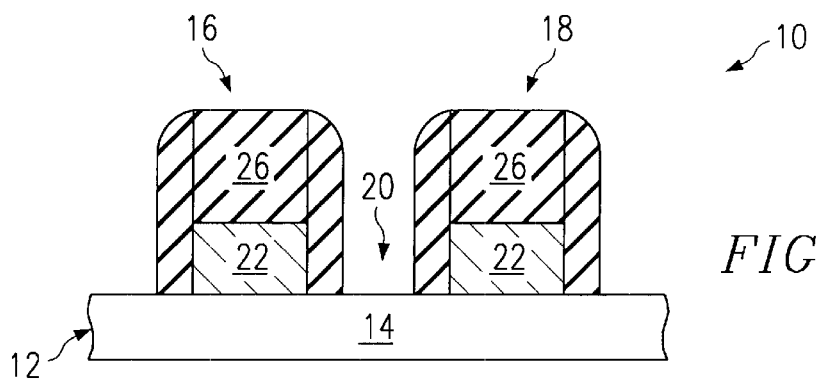
FIGS. 1A–I are a series of schematic cross-sectional diagrams illustrating fabrication of an open can-type stacked capacitor on a substantially uneven surface in accordance with the present invention.

Referring to FIG. 1A, an initial DRAM structure 10 has a substantially uneven surface 12. The substantially uneven surface 12 is unplanarized and includes elements, parts or features protruding from or extending beyond other elements, parts or features of the surface. For the embodiment of FIG. 1A, the substantially uneven surface 12 comprises a base 14 with first and second neighboring access lines 16 and 18 extending from the base 14 and spaced apart by a trough 20. The substantially uneven surface 12 may be any other suitable unplanarized surface on which a storage capacitor is to be formed.

The base 14 may be an insulator formed outwardly of a substrate such as a wafer, an epitaxial or other layer formed on a wafer or other underlying structure, a semiconductor on insulator (SOI) system and the like. The underlying substrate may include semiconductor material conventionally doped and insulated to form channels, source and drains, extensions, motes and other elements of the DRAM. The semiconductor material may comprise single-crystalline silicon or other suitable material.

Access lines 16 and 18 may be bit lines, transistors or other suitable devices used directly or indirectly to selectively access the memory cells. For the embodiment of FIG. 1A, the access lines are bit lines and each include a conductor 22 and a sidewall insulator 26 disposed outwardly of the conductor 22.

Figure 1B:
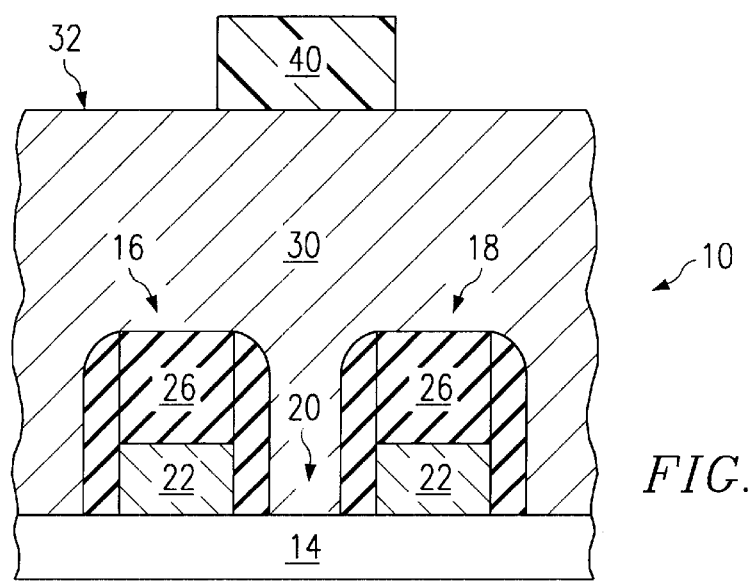

Referring to FIG. 1B, a first conductive layer 30 is formed outwardly of the insulator 14 and the bit lines 16 and 18. The material of the first conductive layer 30 should be selectably etchable to the material of the insulator 14 and the material of the sidewall insulator 26 of the bit lines 16 and 18 to allow selective etching between these elements. In a conventional embodiment in which the insulator 14 comprises silicon dioxide ($SiO_2$) and the sidewall insulator 26 comprises silicon dioxide ($SiO_2$), the first conductive layer 30 may comprise polysilicon. The first conductive layer 30 may comprise other electrically conductive materials suitable for forming an electrode of the storage capacitor.

For the embodiment of FIG. 1B, thee first conductive layer 30 is directly deposited onto the insulator 14 and the first and second bit lines 16 and 18 using conventional integrated circuit fabrication techniques. The first conductive layer 30 may have an essentially planar outer surface 32 and be deposited to a maximum depth of 10,000 angstroms over the insulator 14. In this embodiment, the first conductive layer 30 may have a depth of 5,000 angstroms over the bit lines 16 and 18, where the bit lines 16 and 18 are each 3,000 angstroms in height. The depth of the first conductive layer 30 may be varied depending on the height of the bit lines 16 and 18, the aspect ratio of the trough 20 to be filled in by the first conductive layer 30, configuration of the first electrode to be formed from the first conductive layer 30 and other suitable criteria.

A step mask 40 is formed outwardly of the first conductive layer 30 using conventional photolithographic techniques. The step mask 40 is disposed over the trough 20 and extends partially over each bit line 16 and 18 to correct for alignment fluctuations. As described in more detail below, the mask 40 is generally oval in shape and concentric to a later formed sidewall of the first electrode.

Figure 1C:
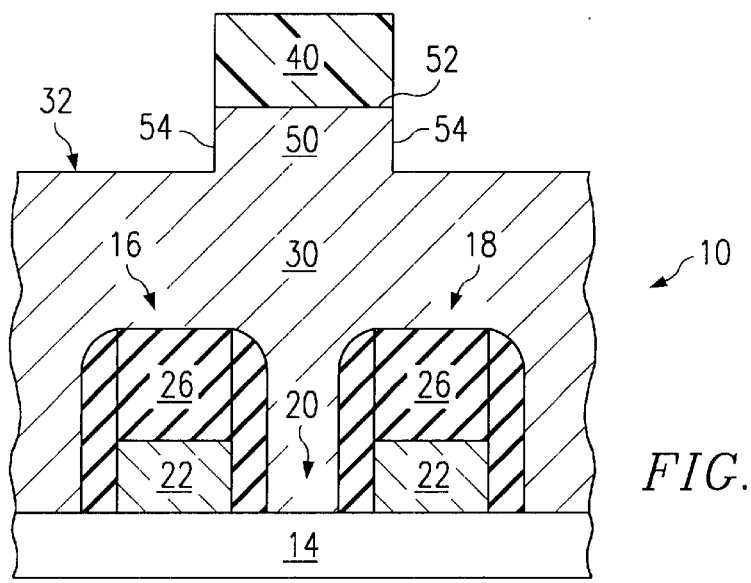

Referring to FIG. 1C, a step 50 is formed in an outer surface 32 of the first conductive layer 30 by removing a portion of the first conductive layer 30 exposed by the step mask 40. The exposed portion of the first conductive layer 30 may be removed by a conventional anisotropic etch, plasma etch or other suitable technique. After the step 50 has been formed, the step mask 40 is removed in accordance with conventional integrated circuit processing techniques.

For the embodiment of FIG. 1C, the step 50 has a substantially planar top 52, substantially vertical edges 54 and generally matches the configuration of the step mask 40. Thus, the step 50 is oval in shape and extends partially over bit lines 16 and 18. Partial extension of the step 50 over the bit lines 16 and 18 corrects for alignment fluctuations and ensures that at least part of the step 50 is disposed over the trough 20 for formation of a base of the first electrode. The step 50 may comprise other suitable types of projections that protrude from surrounding areas of the outer surface 32 of the first conductive layer 30.

In one embodiment, the thickness of the step 50 is equal to a thickness of the first conductive layer 30 to remain at the bottom of the trough 20 and form the base of the first electrode, plus the amount of over-etching that is needed to completely etch off an excess portion of the first conductive layer 30 that will not form part of the first electrode. For the embodiment in which the first conductive layer 30 has an initial depth of 10,000 angstroms over the insulator 14, the bit lines 16 and 18 have a height of 3,000 angstroms and the trough 20 has a width of 1,000 angstroms, the step 50 may have a thickness of 1,500 angstroms.

Figure 1D:
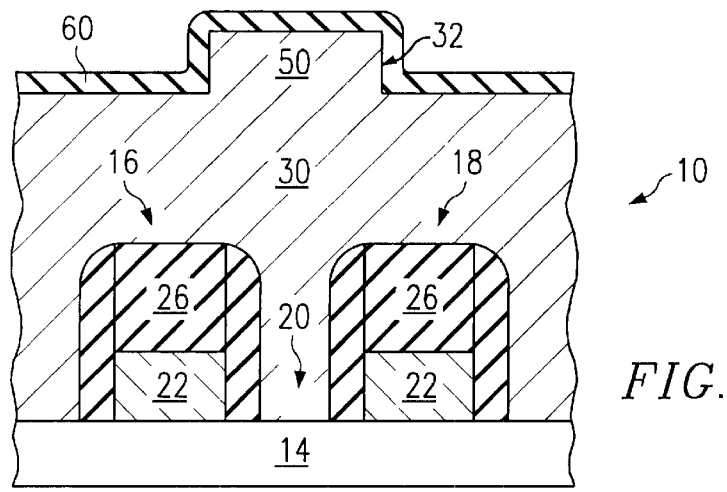

Referring to FIG. 1D, a mask layer 60 is formed outwardly of the first conductive layer 30 and the step 50. As described in more detail below, the material of the mask layer 60 should be selectively etchable to the material of the first conductive layer 30 to allow a sidewall mask to be formed from the mask layer 60 without damage to the first conductive layer 30 and to allow removal if that sidewall mask without damage to an electrode formed from the first conductive layer 30 using the sidewall mask. The mask layer 60 should also be selectively etchable to the material of the insulator 14 and the sidewall insulator 26 of the bit lines 16 and 18 in order to allow later removal of the sidewall mask without damage to the insulator 14 or sidewall insulator 26. In a conventional embodiment in which the insulator 14 comprises silicon dioxide ($SiO_2$), the sidewall insulator 26 comprises silicon dioxide ($SiO_2$), the first conductive layer 30 comprises polysilicon, the mask layer 60 may comprise silicon nitride ($Si_3N_4$). Other suitable materials for the mask layer 60 include phosphate silicate glass (PSG) or boron phosphate silicate glass (BPSG).

For the embodiment of FIG. 1D, the mask layer 60 is directly deposited onto the outer surface 32 of the first conductive layer 30, including the step 50, using conventional integrated circuit processing techniques. In this embodiment, the mask layer 60 may be deposited to a depth of 300 angstroms. The deposition method and thickness of the mask layer 60 may be varied so long as a suitable sidewall mask can be formed from the layer 60.

Figure 1E:
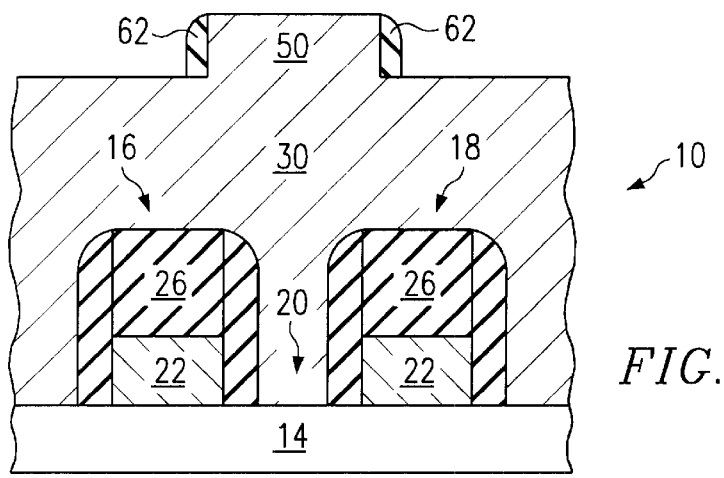

Referring to FIG. 1E, the mask layer 60 is etched back to form a sidewall mask 62 along the edges 54 of the step 50. Thus, the sidewall mask 62 has an annular configuration and an oval shape that is concentric to the step 50. As previously described, the etch should be selective between the material of the mask layer 60 and that of the first conductive layer 30. The etch may be an isotropic etch or other suitable etch.

Figure 1F:
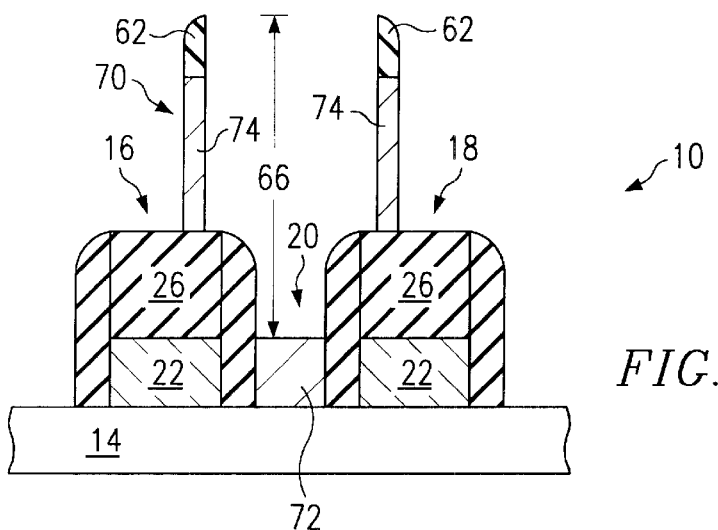

Referring to FIG. 1F, a first, or bottom electrode 70 of the storage capacitor is formed by removing a predetermined thickness 66 of a part of the first conductive layer 30 exposed by the sidewall mask 62. The predetermined thickness 66 of the first conductive layer 30 may be removed by an anisotropic etch or other suitable technique. The etch should be selective between the material of the first conductive layer 30 and that of the insulator 14 and the sidewall insulator 26 of the bit lines 16 and 18 so as not to damage those elements. In this embodiment, the insulator 14 and the bit lines 16 and 18 provide a stop to the etch.

Figure 2:
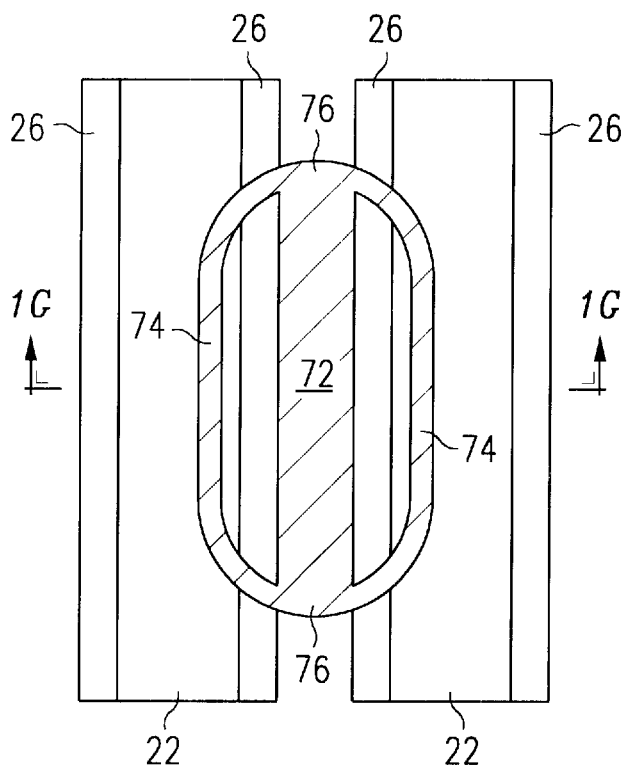
FIG. 2 is a top plan view of the bottom electrode for the open can-type stacked capacitor of FIGS. 1A–I.

As shown by FIGS. 1F and 2, the first electrode 70 includes a base 72 disposed in the trough 20 and a sidewall 74 partially disposed on the bit lines 16 and 18. The base 72 underlies step 50 by the predetermined thickness 66 and accordingly is not removed during the etch. The sidewall 74 is protected by the sidewall mask 62 during the etch. The sidewall 74 is oval in shape and has an annular configuration generally matching that of the sidewall mask 62. The sidewall 74 is annular and oval-shaped in that a cross-section along the top of the sidewall 74 is annular and oval-shaped. The configuration of the sidewall 74 is varied along its height. The sidewall 74 is connected to the base 72 at ends 76 to form an integral bottom electrode 70.

Due to the unevenness of the underlying surface 12, the thickness of the first conductive layer 30 that is removed may vary at different locations, for example, over the bit lines 16 and 18 and the trough 20. Thus, the predetermined thickness 66 is removed at locations of the first conductive layer 30 in which the depth is greater than or equal to the predetermined thickness 66. At shallower locations that are exposed to processing to remove the predetermined thickness 66, the first conductive layer 30 is completely removed.

Figure 1G:
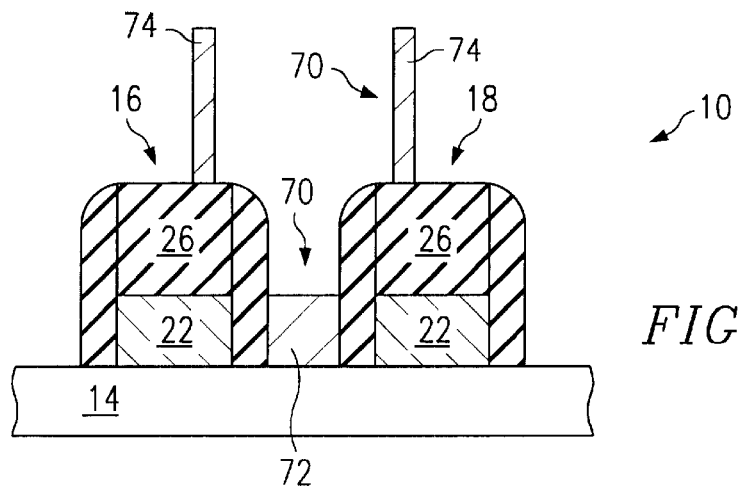

For the embodiment of FIGS. 1F–G, the predetermined thickness 66 is the thickness between the top 52 of the step 50 and the top of the base 72 of the first electrode 70. Removal of this thickness is sufficient to ensure the removal of an excess portion of the first conductive layer 30 not comprising the bottom electrode 70. Thus, the predetermined thickness 66 is the thickness of the first conductive layer 30 over the insulator 14 after the step 50 has been formed, plus an additional thickness to allow over-etching and ensure the removal of the excess portion of the first conductive layer 30. In this embodiment, the base 72 will have a thickness substantially equal to that of the step 50. The sidewall 74 will extend from the trough 20 and the bit lines 16 and 18 to the bottom of the sidewall mask 62.

Referring to FIG. 1G, the sidewall mask 62 is removed to leave the first electrode 70. The sidewall mask 62 may be removed by a conventional etch or other suitable process. As previously discussed, the sidewall mask 62 is preferably selectively etchable relative to the insulator 14, the sidewall insulator 26 of the bit lines 16 and 18 and the first electrode 70 to allow the mask 62 to be removed without damage to those structures.

Figure 1H:
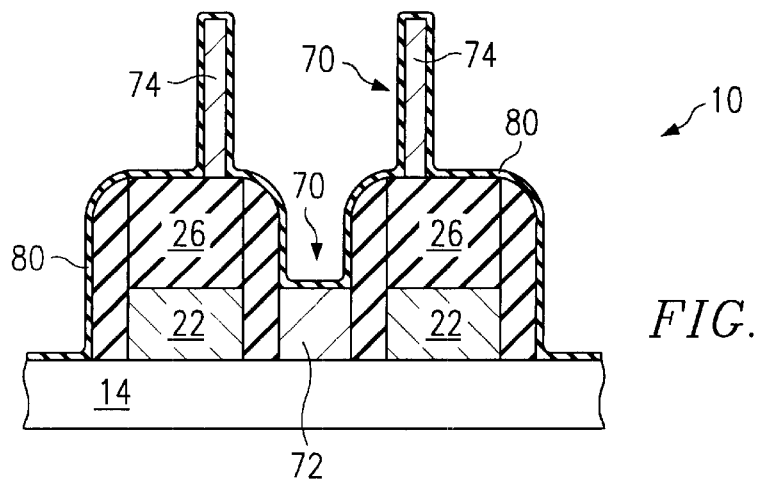

Referring to FIG. 1H, a dielectric layer 80 is formed outwardly of the first electrode 70. The dielectric layer 80 forms a capacitor dielectric for the storage capacitor. The capacitor dielectric 80 is outward of the first electrode 70 in that it is not between the first electrode 70 and an underlying layer. The capacitor dielectric may be on, above, to the side or at a combination of these and other suitable positions relative to the first electrode 70. In one embodiment, the dielectric layer 80 is deposited to a depth of about 50 to 100 angstroms on the first electrode 70, insulator 14 and bit lines 16 and 18 using conventional integrated circuit processing techniques. Suitable materials include oxide-nitride (ON), oxy-nitride-oxide (ONO), tantalum oxide ($Ta_2O_5$) and the like.

Figure 1I:
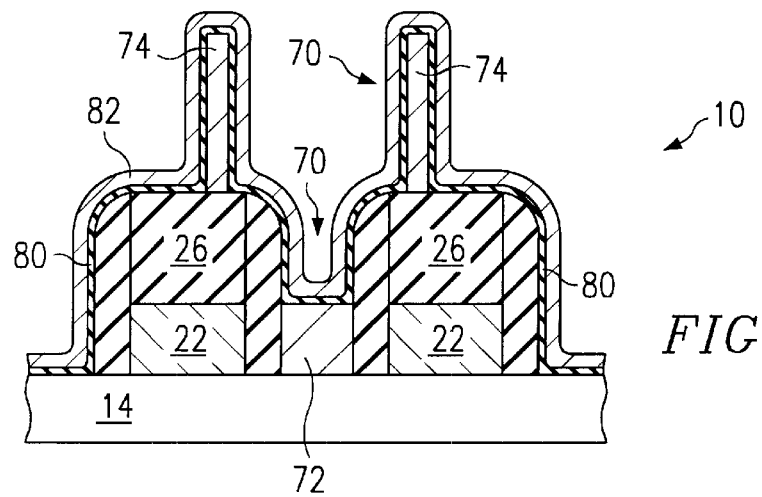

Referring to FIG. 1I, a second conductive layer 82 is deposited outwardly of the dielectric layer 80. The second conductive layer 82 forms a second, or upper electrode for the storage capacitor. The second electrode 82 is outward of the capacitor dielectric in that it is not between the capacitor dielectric and an underlying layer. The second electrode 82 may be on, above, to the side or at a combination of these and other suitable positions relative to the capacitor dielectric. In one embodiment, the second conductive layer 82 is deposited to a depth of 500 angstroms on the dielectric layer 80. Suitable materials include polysilicon and other electrically conductive materials suitable for forming an electrode of the storage capacitor.

The first and second electrodes 70 and 82, together with the capacitor dielectric 80, form an open can-type stacked capacitor for the DRAM cell. The open can-type configuration provides a large surface area between the electrodes 70 and 82 and thus a high charge storage per planar unit of area in the DRAM. In accordance with the present invention, the open can-type storage capacitor is formed on and between bit lines 16 and 18 extending from the insulator 14 or other substantially uneven surface 12 such that planarization of the surface can be omitted and the cost of manufacturing the DRAM reduced. In addition, wet etching used in planarization processing and particle generation associated with wet etching is minimized.

In another embodiment of the present invention, the access lines 16 and 18 may be word lines. In this embodiment, the insulator 14 are gate insulators that have a thickness of about 50 angstroms. The bottom electrode is rotated 90 degrees to be perpendicular to the word lines.

FIGS. 3A–G are a series of schematic cross-sectional diagrams illustrating fabrication of a bottom electrode for an open can-type stacked capacitor in accordance with another embodiment of the present invention. The open can-type stacked capacitor of this embodiment may be used for DRAM cells and other suitable types of memory arrays and electronic circuits.

Figure 3A:
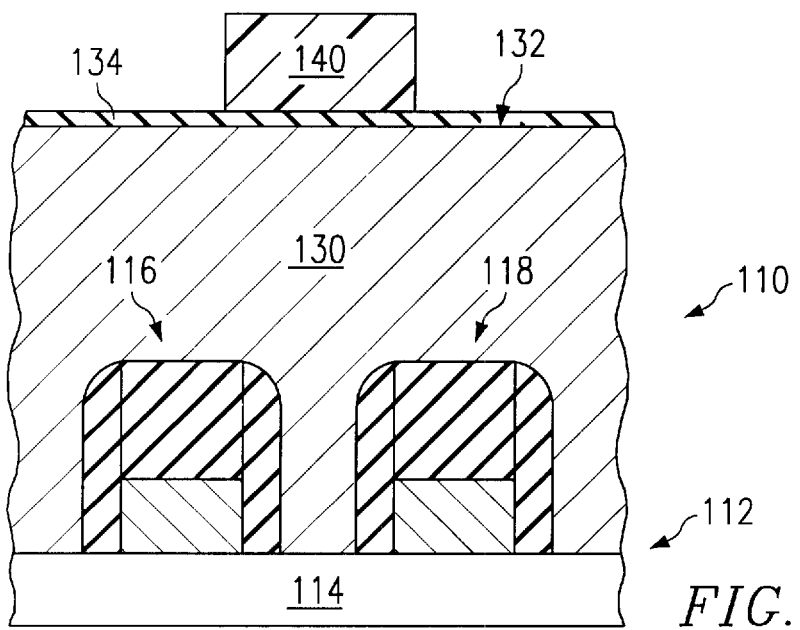
FIGS. 3A–G area a series of schematic cross-sectional diagrams illustrating fabrication of a bottom electrode for an open can-type stacked capacitor in accordance with another embodiment of the present invention.

Referring to FIG. 3A, an initial DRAM structure 110 has a substantially uneven surface 112 comprising an insulator 114 with first and second bit lines 116 and 118 extending from the insulator 114 and spaced apart by a trough 120. A first conductive layer 130 is formed outwardly of the insulator 114 and the bit lines 116 and 118. The substantially uneven surface 112, insulator 114, bit lines 116 and 118, trough 120 and first conductive layer 130 are formed as previously described in connection with corresponding structures of FIGS. 1A–I.

A step mask layer 134 is formed outwardly of the first conductive layer 130. As described in more detail below, the material of the step mask layer 134 should be selectively etchable to the material of the first conductive layer 130 to allow a step mask formed from the step mask layer 134 to be removed without damage to an underlying portion of the first conductive layer 130. The step mask layer 134 should also be selectively etchable to the material of the insulator 114 and bit lines 116 and 118 for the same reason. In a conventional embodiment in which the insulator 114 comprises silicon dioxide ($SiO_2$), the first conductive layer 130 comprises polysilicon, the step mask layer 134 may comprise an insulator such as PSG, BPSG and the like.

For the embodiment of 3A, the step mask layer 134 is directly deposited onto an outer surface 132 of the first conductive layer 130 using conventional integrated circuit processing techniques. In this embodiment, the step masking layer 134 may be deposited to a depth of 300 angstroms. The deposition method and thickness of the step mask layer 134 may be varied so long as a suitable step mask can be formed from the layer 134.

A first step mask 140 is formed outwardly of the step mask layer 134 using conventional photolithographic techniques. As described in connection with the step mask 40 of FIGS. 1A–I, the step mask 140 is disposed over the trough 120 and extends partially over each bit line 116 and 118 to correct for alignment fluctuations. The mask 140 is generally oval in shape and concentric to later form the sidewalls of the first electrode.

Figure 3B:
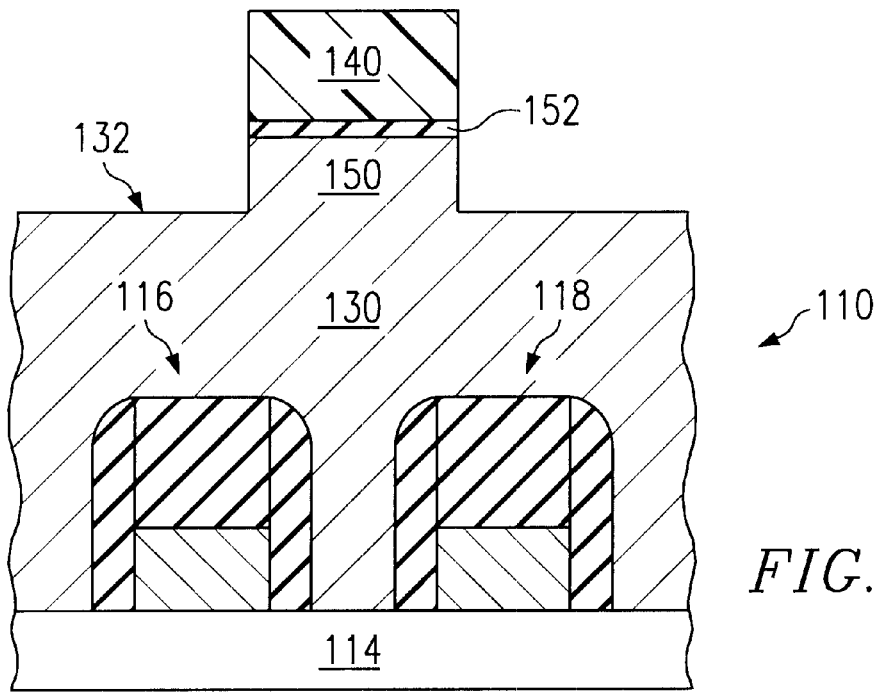

Referring to FIG. 3B, a step 150 is formed in the outer surface 132 of the first conductive layer 130. The step 150 may be formed by removing a portion of the step mask layer 134 exposed by the first step mask 140 and then removing an underlying portion of the first conductive layer 130. The exposed portion of the step mask layer 134 and the underlying portion of the first conductive layer 130 may be removed by separate anisotropic etches, plasma etches or other suitable techniques. After the step 150 has been formed, the step mask 140 is removed in accordance with conventional integrated circuit processing techniques. The remaining portion of the step mask layer 134 disposed outwardly of the step 150 forms a second step mask 152.

Figure 3C:
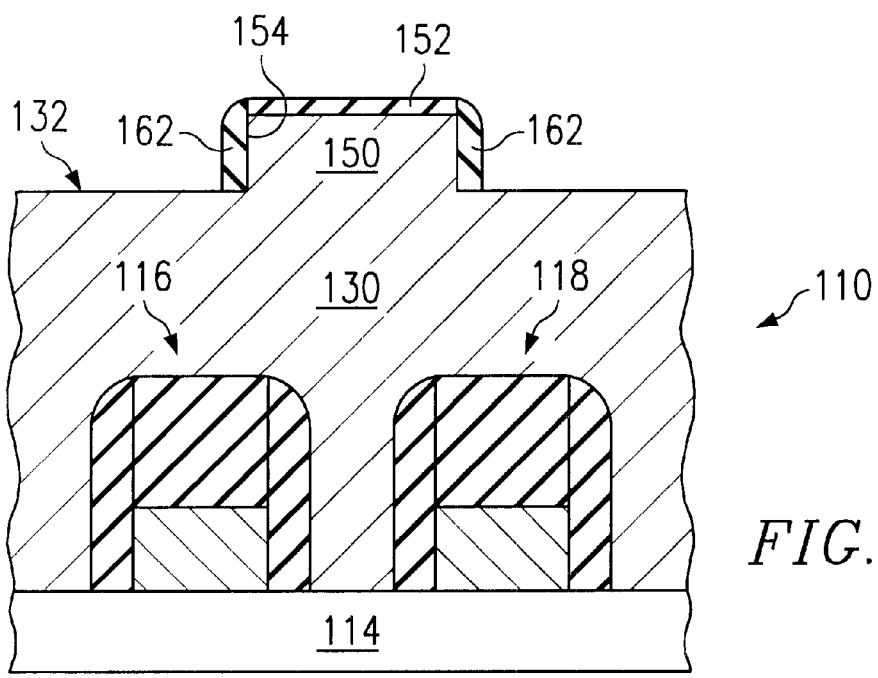

Referring to FIG. 3C, a sidewall mask 162 is formed along edges 154 of the step 150. The sidewall mask 162 connects to the second step mask 152 to completely cover the step 150. As previously described in connection with the sidewall mask 62 of FIGS. 1A–I, the material of the sidewall mask 162 should be selectively etchable to the first conductive layer 130 to allow the mask to be removed without damage to an electrode formed from the first conductive layer 130 using the sidewall mask 162. The sidewall mask 162 should also be selectively etchable to the material of the insulator 114 and the bit lines 116 and 118 in order to allow removal of the mask 162 without damage to those structures. In addition, the sidewall mask 162 should allow the second step mask 152 to be removed without damage to the mask 162. For the embodiment in which the second step mask 152 comprises PSG or BPSG, the sidewall mask 162 may comprise silicon nitride ($Si_3N_4$).

Figure 3D:
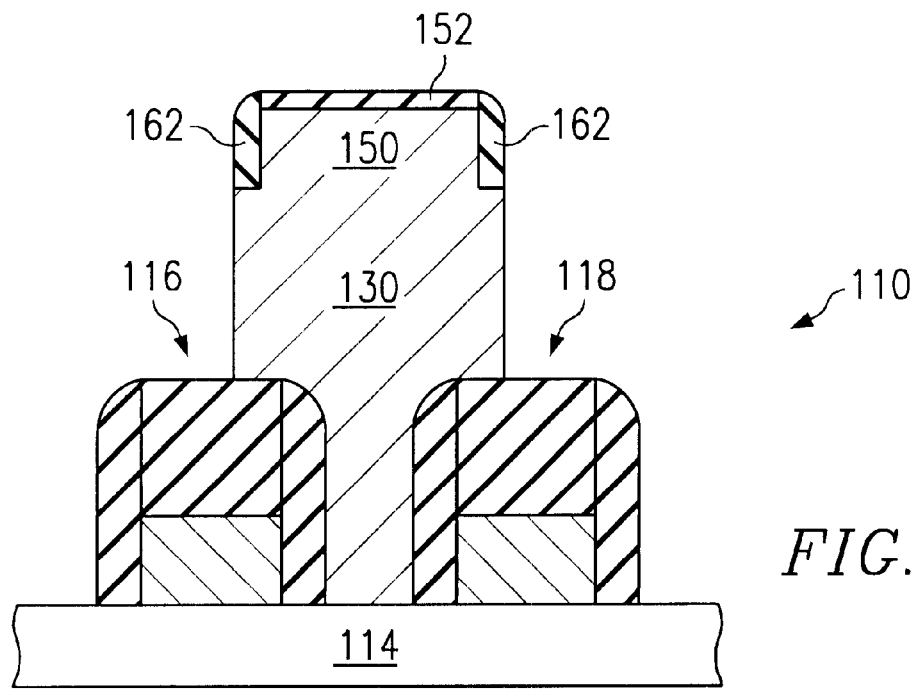

Referring to FIG. 3D, an exposed portion of the first conductive layer 130 not protected by the second step and sidewall masks 152 and 162 is removed. The exposed portion may be removed by an anisotropic etch or other suitable technique. The etch should be selective between the material of the first conductive layer 130 and that of the insulator 114, bit lines 116 and 118, second step mask 152 and sidewall mask 162. In this embodiment, the insulator 114 and bit lines 116 and 118 provide a stop to the etch.

Figure 3E:
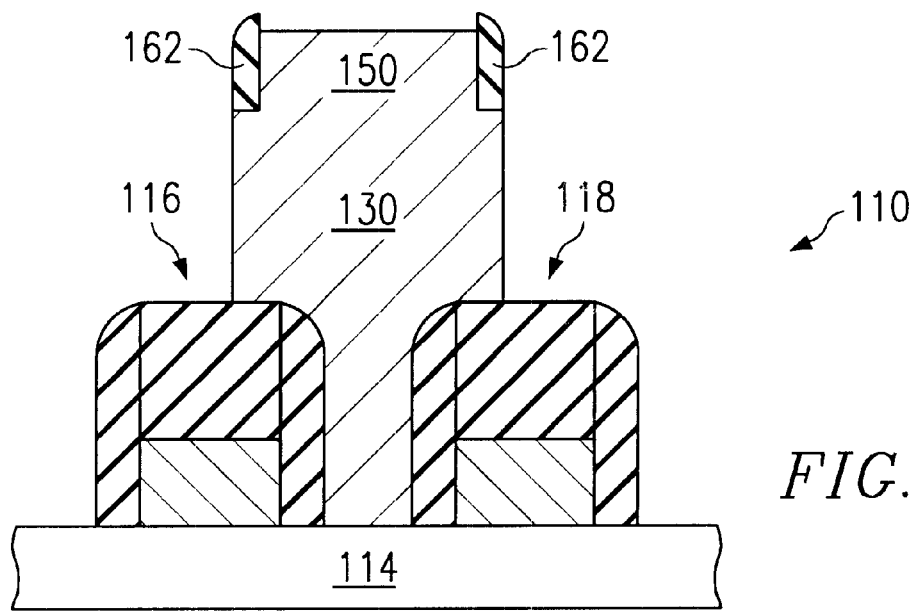

Referring to FIG. 3E, the second step mask 152 is removed to expose the step 150 and underlying portion of the first conductive layer 130. The second step mask 152 may be removed by conventional etch or other suitable process. As previously discussed, the second step mask 152 is preferably selectively etchable relative to the insulator 114, the bit lines 116 and 118, first conductive layer 130 and sidewall mask 162 to allow the mask 152 to be removed without damage to those structures.

Figure 3F:
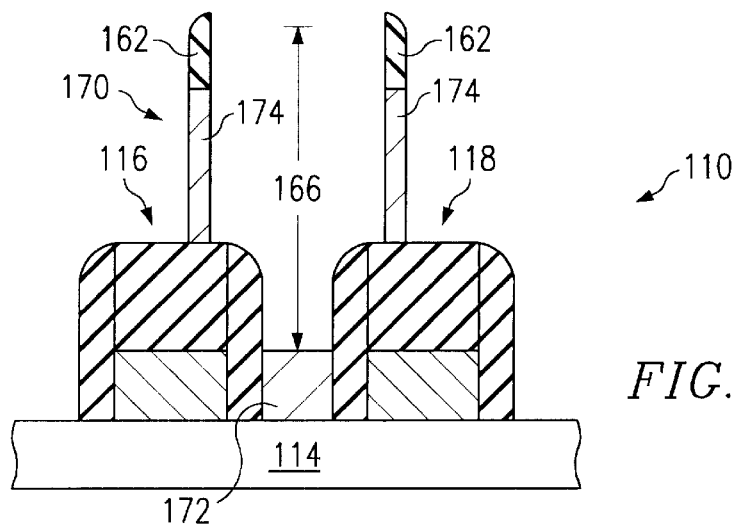

Referring to FIG. 3F, a first, or bottom electrode 170 of the storage capacitor is formed by removing a predetermined thickness 166 of the remaining part of the first conductive layer 130. The predetermined thickness 166 of the first conductive layer 130 may be removed by an anisotropic etch or other suitable technique. The etch should be selective between the material of the first conductive layer 130 and that of the insulator 114, bit lines 116 and 118 and sidewall mask 162. Accordingly, the sidewall mask 162 protects an underlying portion of the first conductive layer 130. The insulator 114 and bit lines 116 and 118 provide a stop to the etch.

In this embodiment, the predetermined thickness 166 is independent of the need to remove an excess portion of the first conductive layer 130 not comprising the first electrode 170. Accordingly, this embodiment may be preferred where a large amount of over-etching is required outside the storage node region. The step 150 is sized to best form the sidewall mask 162 and is generally independent of the dimensions of the first electrode 170.

As shown by FIG. 3F, the first electrode 170 includes a base 172 disposed in the trough 120 and a sidewall 174 partially disposed on bit lines 116 and 118. As previously described in connection with first electrode 70 of FIGS. 1A–I, the base 172 of first electrode 170 underlies the step 150 by the predetermined thickness 166 and accordingly is not removed during the etch. The sidewall 174 is protected by the sidewall mask 162 during the etch. The sidewall 174 is oval in shape and has an annular configuration generally matching that of the sidewall mask 162. The sidewall 174 is connected to ends of the base 172 to form an integral bottom electrode 170.

Figure 3G:
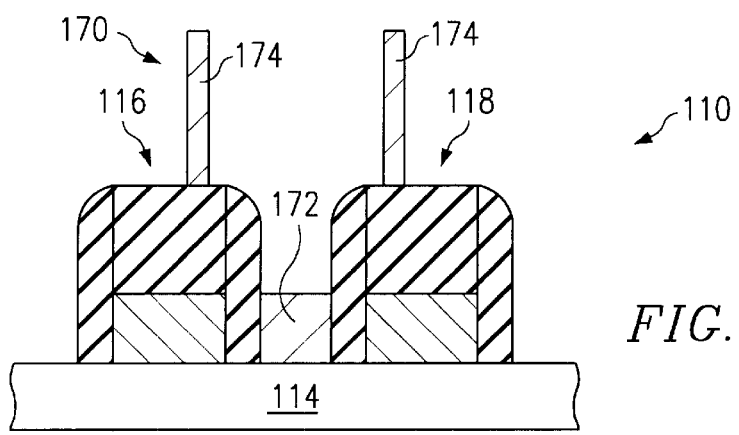

Referring to FIG. 3G, the sidewall mask 162 is removed as previously described in connection with the sidewall mask 62 of FIG. 1. A capacitor dielectric and a second, or upper, electrode are formed outwardly of the first electrode 170 as previously described in connection with FIGS. 1A–I. The open can-type configuration of the storage capacitor provides a large surface area between the electrodes and thus a high charge per planar unit area in the DRAM.

Figure 4:
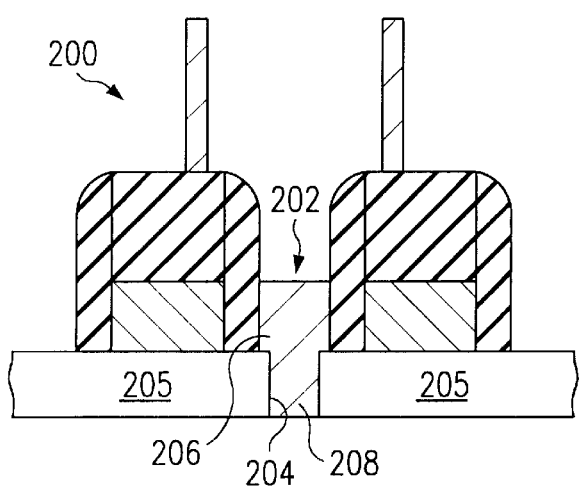
FIG. 4 is a schematic cross-sectional diagram illustrating a bottom electrode for an open can-type stacked capacitor in accordance with still another embodiment of the present invention.

FIG. 4 is a cross-sectional diagram illustrating a first, or bottom, electrode 200 of an open can-type storage capacitor, such as first electrodes 70 and 170 previously described in connection with FIGS. 1 and 2, at the location where a base 202 extends into a contact hole 204 formed in the insulator 205 for connection to another element of the DRAM array, such as a source or drain region of the access transistor.

The contact hole 204 is formed prior to formation of a first conductive layer and is filled in by material from that layer. In this way, the first electrode 200 is connected to another element of the DRAM without need of a separately formed contact filling. Accordingly, additional fabrication steps are omitted and the cost of the DRAM is further reduced.

Although the present invention has been described with several embodiments, various changes and modifications may be suggested to one skilled in the art. It is intended that the present invention encompass such changes and modifications as fall within the scope of the appended claims.

What is claimed is:

1. An electronic device having an open can-type stacked capacitor on a substantially uneven surface, comprising:
   a base layer overlying a substrate;
   a first elongated structure and a second elongated structure disposed on the base layer spaced apart by a trough;

a first electrode comprising a base disposed in the trough and an annular sidewall extending outwardly from the base layer, wherein the annular sidewall is a hollow cylindrical shape with an open top and an open bottom such that a portion of the annular sidewall is disposed on the first elongated structure and another portion of the annular sidewall is disposed on the second elongated structure, wherein the base connects with the annular sidewall only where the annular sidewall crosses over the trough, thereby leaving a void in the first electrode between the base and the portion of the annular wall that is disposed on the first elongated structure;

a dielectric layer disposed outwardly of the first electrode; and a second electrode disposed outwardly of the dielectric layer.

2. The device of claim 1, wherein the base of the first electrode extends into a contact hole formed in the base layer for connection to another element.

3. The device of claim 1, wherein the annular sidewall has an inside surface and an outside surface and wherein both the inside surface and the outside surface are formed by a single etch step.

4. The device of claim 1 wherein the first elongated structure and the second elongated structure are each insulated conductive elements.

5. The device of claim 4, being a dynamic random access memory array and wherein the first elongated structure and the second elongated structure are each insulated access lines.

6. The device of claim 1, wherein the hollow cylindrical shape has a non-circular cross section.

* * * * *